United States Patent
Yu et al.

(10) Patent No.: US 7,309,905 B2
(45) Date of Patent: Dec. 18, 2007

(54) BIPOLAR-BASED SCR FOR ELECTROSTATIC DISCHARGE PROTECTION

(75) Inventors: Kuo-Feng Yu, Hsin-Chu (TW); Jian-Hsing Lee, Hsin-Chu (TW); Jiaw-Ren Shih, Hsin-Chu (TW); Fu Chin Yang, Fongshan (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 269 days.

(21) Appl. No.: 11/065,848

(22) Filed: Feb. 25, 2005

(65) Prior Publication Data

US 2006/0192251 A1 Aug. 31, 2006

(51) Int. Cl.
*H01L 29/00* (2006.01)
*H01L 29/74* (2006.01)
*H01L 31/111* (2006.01)

(52) U.S. Cl. ............... 257/511; 257/109; 257/E29.187; 438/313

(58) Field of Classification Search ................. 257/109, 257/511
See application file for complete search history.

(56) References Cited

U.S. PATENT DOCUMENTS 3,453,505 A * 7/1969 Offner et al. ............... 257/109
5,747,834 A * 5/1998 Chen et al. ................. 257/111
6,803,259 B2 * 10/2004 Lee ............................ 438/133

OTHER PUBLICATIONS

Chen, J.Z., et al., "Bipolar SCR ESD Protection Circuit for High Speed Submicronbipolar/BiCMOS Circuits", IEDM 95, Dec. 10-13, 1995, p. 337-40.*

* cited by examiner

*Primary Examiner*—Howard Weiss
(74) *Attorney, Agent, or Firm*—Duane Morris LLP (57) ABSTRACT

A system and method is disclosed for implementing a new bipolar-based silicon controlled rectifier (SCR) circuit for an electrostatic discharge (ESD) protection. The SCR circuit comprises a bipolar device to be formed on a semiconductor substrate. The bipolar device comprises at least an N-well for providing a high resistance and a P+ material to be used as a collector thereof for further providing a high resistance. At least an Nmoat guard ring and a Pmoat guard ring surround the bipolar device, wherein when an ESD event occurs, the high resistance provided by the N-well and the P+ material of the bipolar device increases a turn-on speed.

20 Claims, 9 Drawing Sheets

BIPOLAR-BASED SCR FOR ELECTROSTATIC DISCHARGE PROTECTION

BACKGROUND

The present disclosure relates generally to integrated circuit designs, and more particularly to methods for implementing a new bipolar-based silicon controlled rectifier for electrostatic discharge protection circuit.

The gate oxide of a metal-oxide-semiconductor (MOS) transistor of an integrated circuit is most susceptible to damage. The gate oxide may be destroyed by being contacted with a voltage only a few volts higher than the supply voltage. It is understood that a regular supply voltage in an integrated circuit is 5.0, 3.3 volts or even lower. Electrostatic voltages from common environmental sources can easily reach thousands, or even tens of thousands of volts. Such voltages are destructive even though the charge and any resulting current are extremely small. For this reason, it is of critical importance to discharge any static electric charge, as it builds up, before it accumulates to a damaging voltage.

It has been found that silicon controlled rectifier (SCR) can be one of the most effective devices for preventing electrostatic discharge (ESD) damage to chips due to its low turn-on impedance, low capacitance, low power dissipation, and high current sinking/sourcing capabilities. ESD protection circuitries that utilize SCR can enhance ESD protection for faster dissipation of ESD pulses during an ESD event before harmful charges can build up and damage the IC.

While methods for ESD protection circuit implemented with SCR are available, there are still flaws in traditional designs of SCRs used for ESD protection. In conventional SCRs used for ESD protection, buried layer and deep N+ collector sinkers are implemented at N-well to lower the collect resistance. These low resistance material can hinder the turn-on speed of the SCR, thus causing poor ESD performance.

Desirable in the art of integrated circuit designs are methods to improve the SCR and ESD performances of an ESD protection circuit.

SUMMARY

In view of the foregoing, this disclosure provides methods for implementing a new bipolar-based silicon controlled rectifier (SCR) for an electrostatic discharge (ESD) protection circuit.

A system and method is disclosed for implementing a new bipolar-based silicon controlled rectifier (SCR) circuit for an electrostatic discharge (ESD) protection. The SCR circuit comprises a bipolar device to be formed on a semiconductor substrate. The bipolar device comprises at least an N-well for providing a high resistance and a P+ material to be used as a collector thereof for further providing a high resistance. At least an Nmoat guard ring and a Pmoat guard ring surround the bipolar device, wherein when an ESD event occurs, the high resistance provided by the N-well and the P+ material of the bipolar device increases a turn-on speed.

The construction and method of operation of the disclosure, however, together with additional objects and advantages thereof will be best understood from the following description of specific embodiments when read in connection with the accompanying drawings.

DETAILED DESCRIPTION

The present disclosure provides a detailed description of the systems to improve electrostatic discharge (ESD) performance of ESD protection circuits by implementing a new bipolar-based silicon controlled rectifier (SCR).

Figure 1A:
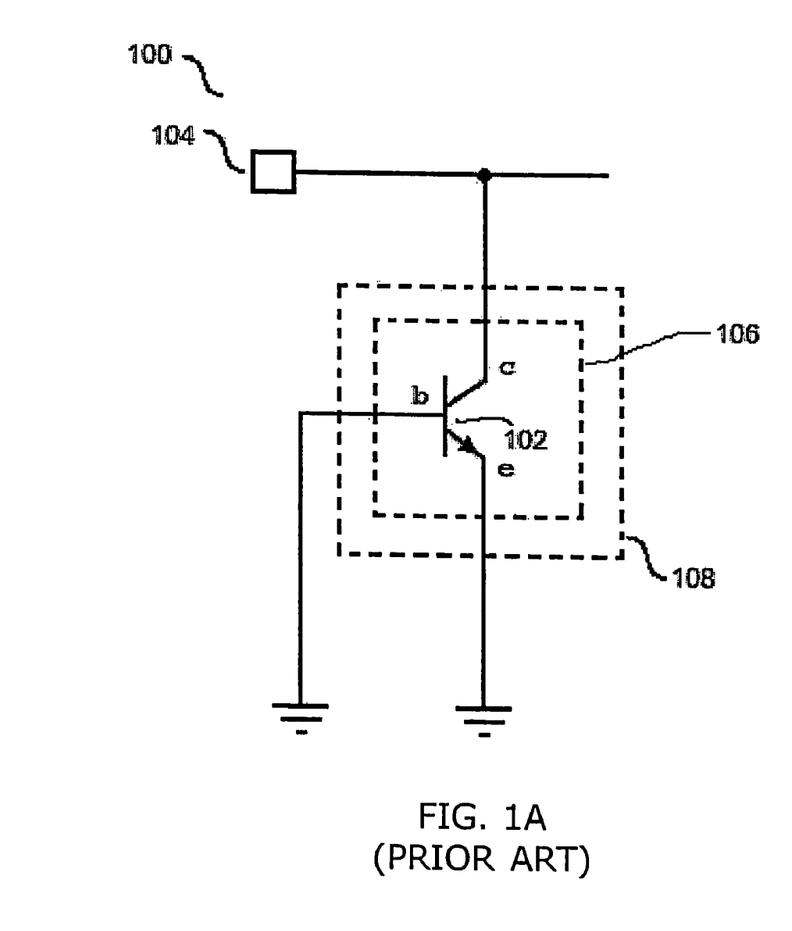
FIG. 1A presents a diagram of a conventional SCR structure used for ESD protection.

FIG. 1A presents a diagram 100 of a conventional SCR structure used for ESD protection. Both the emitter and base of a NPN transistor 102 are tied to ground while the collector thereof is tied to a pad 104. In order to form the SCR necessary for better ESD protection, a Nmoat guard ring 106 and a Pmoat guard ring 108 are implemented. The Pmoat guard ring 108 is connected to a substrate potential to reverse-bias the Pmoat-to-N-well junction. The Nmoat guard ring 106 is connected to a positive power supply source to help drive the depletion region deeper into the substrate to enhance collection efficiency. In a typical circuit, the positive power supply source is the VCC of the circuit.

While the two guard rings will not be shown for any of the cross-sectional views of the SCR in all embodiments of this disclosure, it is understood that at least a Nmoat guard ring and a Pmoat guard ring are expected to be formed around the transistors depicted in order to form a complete PNPN bipolar SCR structure.

Figure 1B:
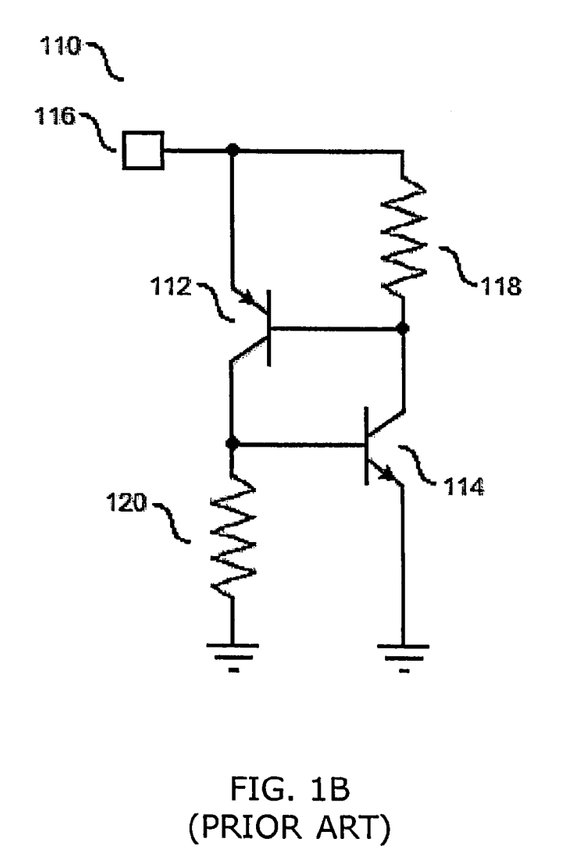
FIG. 1B presents a schematic diagram of a conventional SCR structure used for ESD protection.

FIG. 1B presents a schematic diagram 110 of a conventional SCR structure used for ESD protection. It is understood by those skilled in the art that the schematic diagram 110 is essentially a schematic depiction of the diagram 100.

A PNP bipolar transistor 112 is connected to the base of a NPN bipolar transistor 114 and a pad 116. Both the base of the PNP bipolar transistor 112 and the collector of a NPN bipolar transistor 114 are connected to a resistor 118 which represents the resistance of the N-well, while both bipolar transistors 112 and 114 are also tied to a resistor 120 which represents the resistance of the P-type substrate. In a BiCMOS process, the bipolar transistors 112 and 114 are parasitic devices. To illustrate, the PNP bipolar transistor 112 includes a P+ diffusion inside the N-well and P-type substrate, while the NPN bipolar transistor 114 may include a N-well, P-type substrate, and a N+ diffusion.

The SCR structure depicted in the schematic diagram 110 is triggered into conduction by the collector-base avalanche of either the bipolar transistor 112 or 114. For example, if the NPN bipolar transistor 114 avalanches first, carriers injected into the base of the NPN bipolar transistor 114 will cause the transistor to conduct. This allows the NPN bipolar transistor 114 to pull current from the base of the PNP bipolar transistor 112, thereby forcing it to turn on and provide additional base drive for the NPN bipolar transistor 114. Conduction will continue until the input voltage drop to a point where the resistors 118 and 120 can extract more current than what the bipolar transistors 112 and 114 can supply.

Figure 1C:
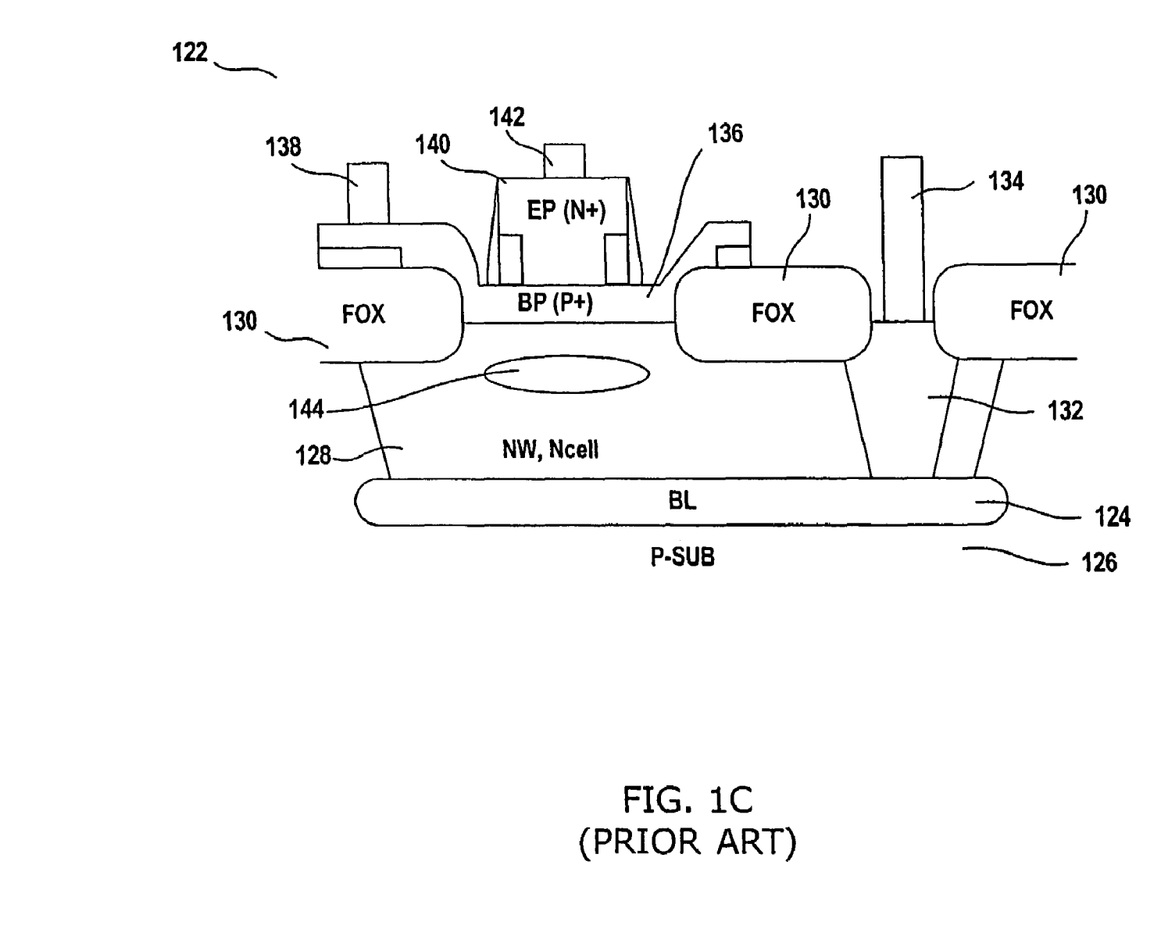
FIG. 1C illustrates a cross-sectional view of a bipolar device for a SCR fabricated using a conventional silicon-germanium process.

FIG. 1C illustrates a cross-sectional view of a bipolar device 122 for a SCR fabricated using a conventional silicon-germanium (SiGe) process. To construct this structure, a brief thermal oxidation grows a thin layer of oxide across the wafer, which is then patterned using the buried layer mask and oxide etch open window. This allows ion implantation of an N-type, lightly-doped buried layer 124 to form above a P-type substrate 126. A N-well 128 is formed above the buried layer 124, and field oxides 130 are grown after the N-well 128 is formed. The N-well 128 is driven down before it and the buried layer 124 collide to permit the timely insertion of a N+ collector/sinker 132, where a metal contact 134 provides an electrical connection thereto. A base mask is used to pattern a P+ base region 136, and a metal contact 138 is formed to connect to the base region 136, which is the base of the bipolar device 122. Finally, a N+ emitter 140 is diffused into the base region 136, and is connected to the rest of the circuitry by a metal contact 142 attached thereto. An optional local collector 144 can also be implemented in the N-well 128 to reduce the resistance to improve the performance of the bipolar device 122.

It is understood that the bipolar device 122 shows only the NPN transistor used for a conventional NPN SCR. A Pmoat guard ring and a Nmoat guard ring will be implemented to form a complete PNPN bipolar SCR structure. While this a conventional SCR structure having the bipolar device 122 can be used for ESD protection circuits, it undesirably provides poor ESD performance due to the low resistance of the buried layer 124 and the deep N+ collector/sinker 132. Material with a higher resistance is desired during ESD events to improve ESD performance.

Figure 2A:
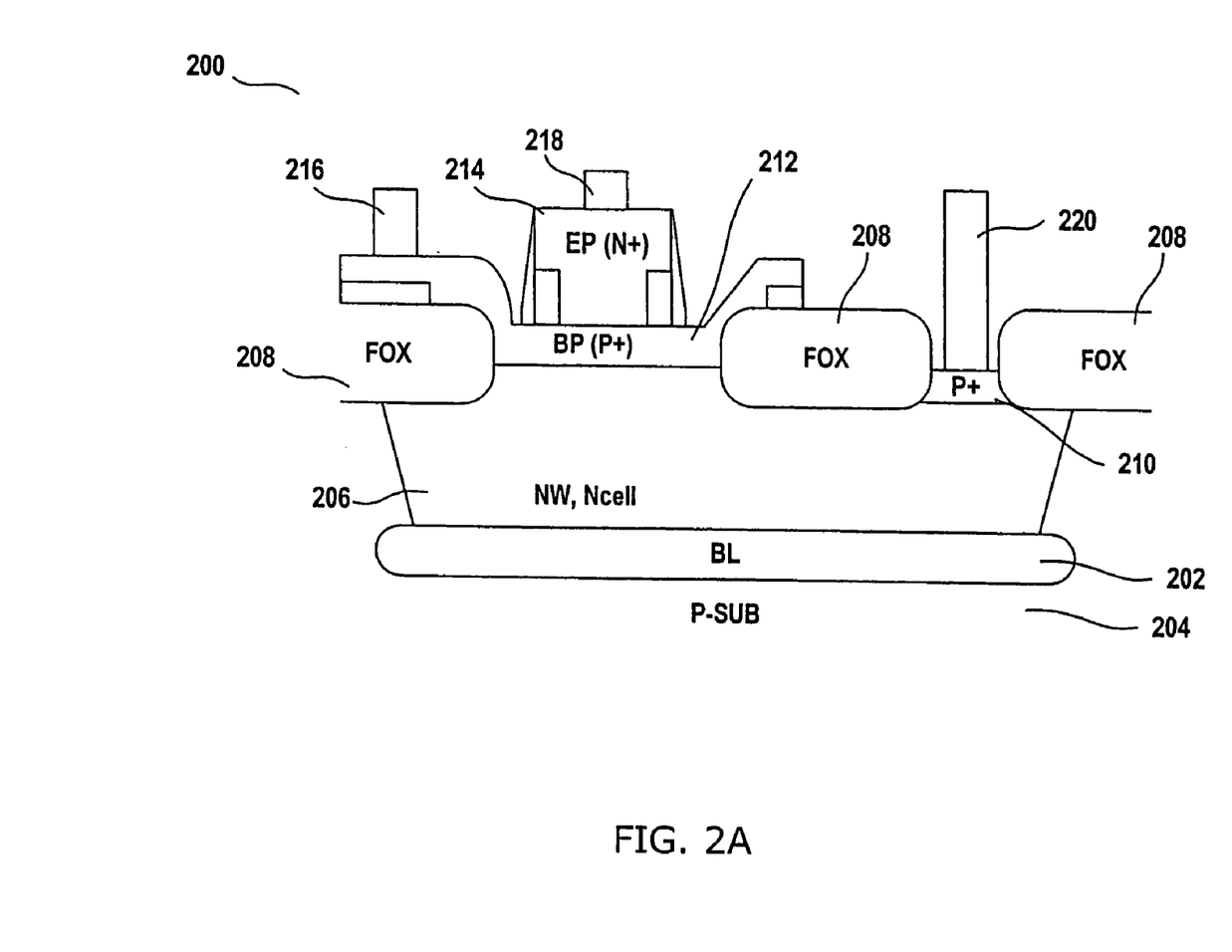
FIG. 2A illustrates a cross-sectional view of a bipolar device for a new bipolar-based SCR in accordance with the first embodiment of the present disclosure.

FIG. 2A illustrates a cross-sectional view of a bipolar device 200 for a new bipolar-based SCR in accordance with the first embodiment of the present disclosure.

A bipolar device 200 still has an ion implantation of an N-type, lightly-doped buried layer 202 formed above a P-type substrate 204. A brief thermal oxidation grows a thin layer of oxide across the wafer, which is then patterned by using a buried layer mask. An N-well 206 is also formed above the buried layer 202, and field oxides 208 are grown after the N-well 206 is formed. Comparing the bipolar devices 122 and 200, the N+ collector/sinker 132 in the bipolar device 122 is replaced with a thin, P+ material 210 in the bipolar device 200. This P+ material 210, which is implanted, is understood to form the collector of the bipolar device 200. A P+ base region 212 is patterned onto the N-well 206 by a base mask, after which a N+ emitter 214 is diffused into the base region 212. Metal contacts 216, 218, and 220 are implemented to provide the connections to the base 212, the emitter 214, and the collector 210, respectively. As it is shown, there are one or more dielectric regions 208 (e.g., field oxides) formed on the N-well 206, the base region is formed between two dielectric regions and the collector region is separated from the base by one of the dielectric regions. In one embodiment, P+ of 210 is used for p terminal of pnpn (SCR) structure, which is replaced from n+ sinker to p+ diffusion.

It is understood that a Pmoat guard ring and an Nmoat guard ring are implemented around the bipolar device 200 to form a PNPN bipolar SCR structure. By replacing the N+ collector/sinker 132 used in the bipolar device 122 with the P+ material 210, ESD current will have to flow through the N-well 206, which is a relatively higher resistance material.

Figure 2B:
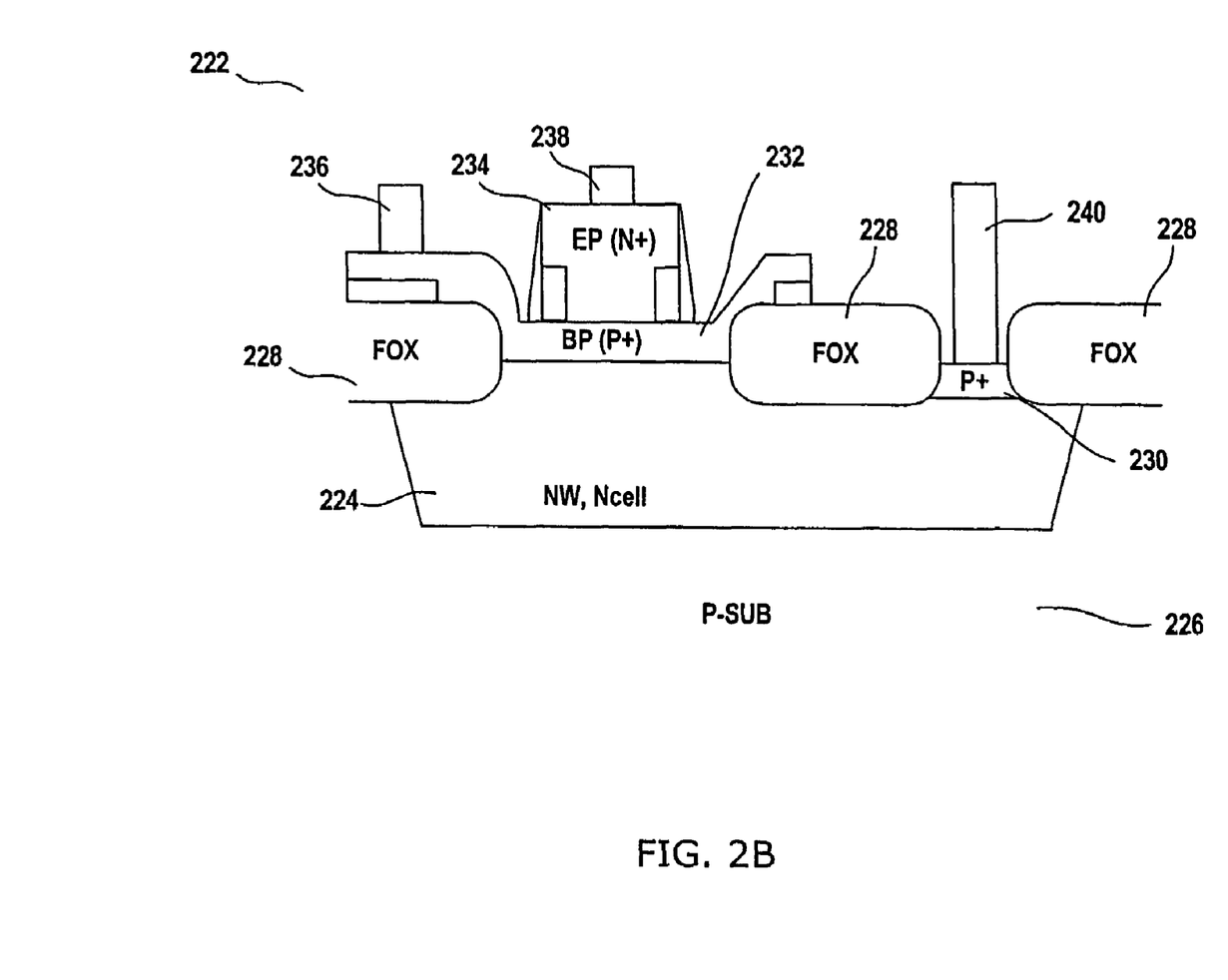
FIG. 2B illustrates a cross-sectional view of a bipolar device for a new bipolar-based SCR in accordance with the second embodiment of the present disclosure.

FIG. 2B illustrates a cross-sectional view of a bipolar device 222 for a new bipolar-based SCR in accordance with the second embodiment of the present disclosure. Comparing the bipolar device 222 with the bipolar device 122, both the buried layer 124 and the N+ collector/sinker 132 of the bipolar device 122 are removed from the bipolar device 222. A N-well 224 is formed directly above a P-type substrate 226, and field oxides 228 are grown after the N-well 224 is formed. A P+ material 230 is implemented to form a collector. A base mask is used to pattern a P+ base region 232 above the N-well 224, after which a N+ emitter 234 is diffused into the base region 232. Metal contacts 236, 238, and 240 are implemented to provide the necessary connections to the base 232, the emitter 234, and the collector 230, respectively. In one embodiment, P+ of 230 is used for p terminal of pnpn (SCR) structure, which is replaced from n+ sinker to p+ diffusion.

Similar to the bipolar device 200, it is understood that a Pmoat guard ring and an Nmoat guard ring are further implemented (not shown) around the bipolar device 222 to form a PNPN bipolar SCR structure. By removing the N+ collector/sinker 132 and the buried layer 124 in the bipolar device 122, ESD performance will significantly improve since the low resistance material used for both the N+ collector/sinker 132 and the buried layer 124 hinders the turn-on of the SCR. Instead, ESD current will have to flow through the N-well 224, made of a relatively high resistance material, thereby allowing the SCR to perform much better during an ESD event.

Figure 2C:
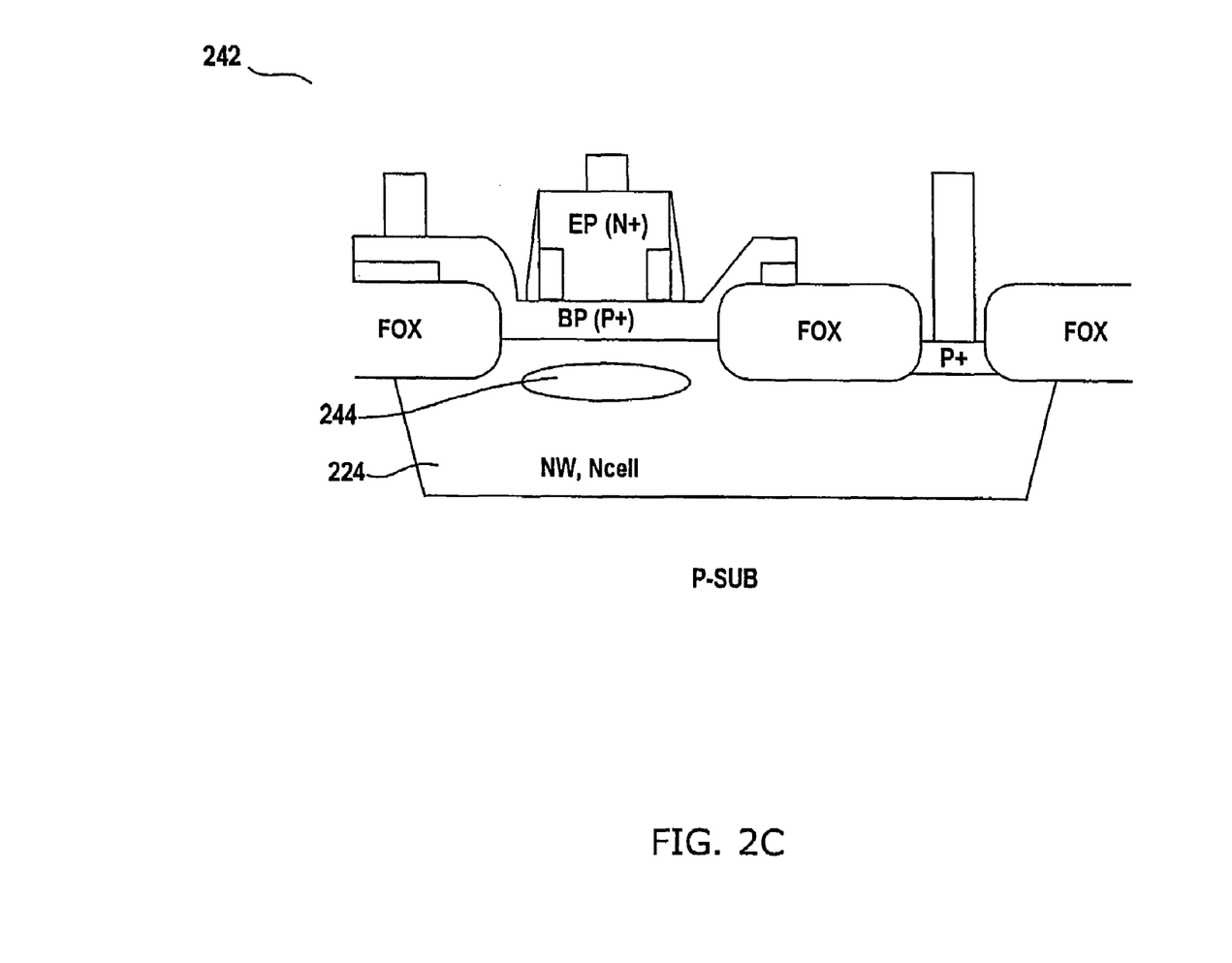
FIG. 2C illustrates a cross-sectional view of a bipolar device for a new bipolar-based SCR in accordance with the third embodiment of the present disclosure.

FIG. 2C illustrates a cross-sectional view of a bipolar device 242 for a new bipolar-based SCR in accordance with the third embodiment of the present disclosure. The bipolar device 242 is almost identical to the bipolar device 222 in FIG. 2B, with the exception of an optional local collector 244 implemented in the N-well 224. Both the buried layer 124 and the N+ collector/sinker 132 of the bipolar device 122 are removed to provide better SCR and ESD performance. The local collector 244 is formed by the bipolar device process to reduce the resistance for improving the non-ESD performance of the bipolar device 242. It is understood that the ESD performance of the bipolar device 242 is similar to that of the bipolar device 222.

Figure 3:
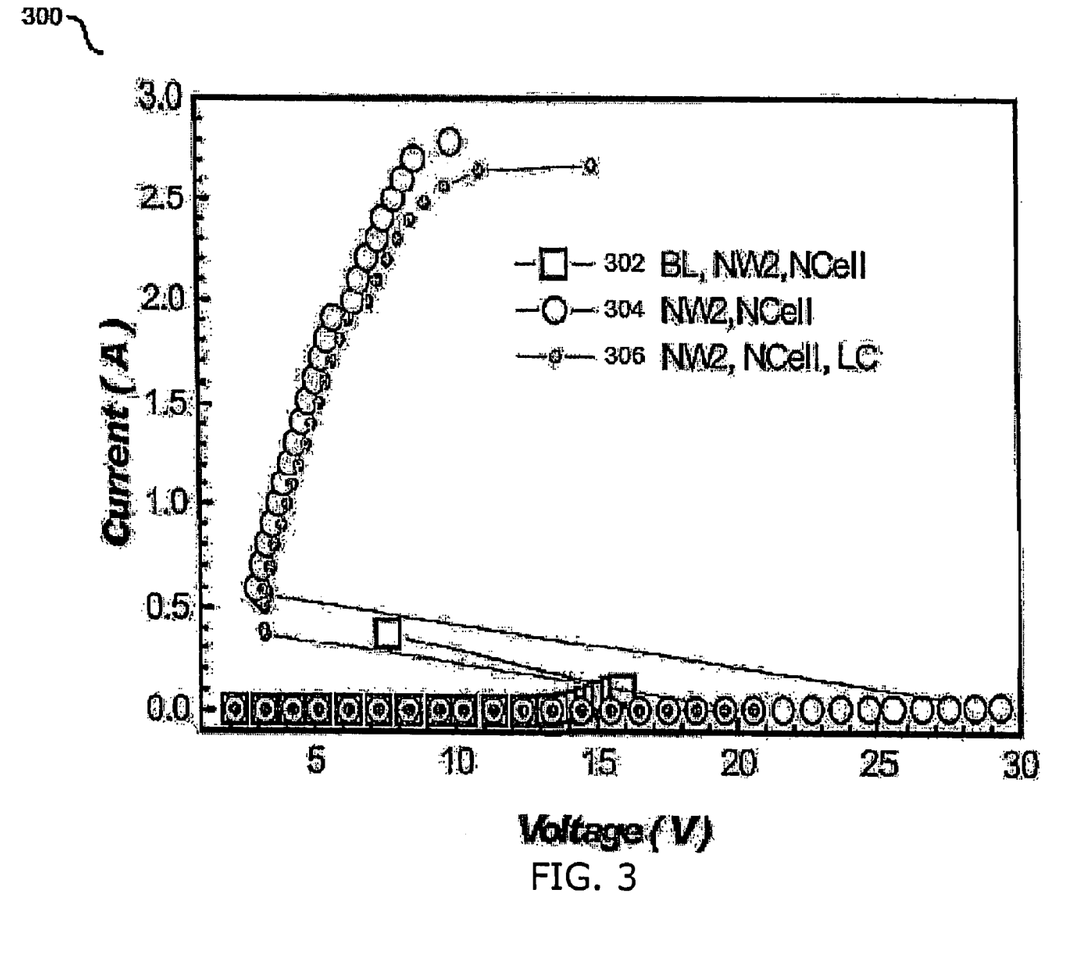
FIG. 3 presents a graph comparing the ESD performances of various ESD protection circuits in accordance with various embodiments of the present disclosure.

FIG. 3 presents a graph 300 comparing the ESD human body mode performances of various ESD protection circuits in accordance with various embodiments of the present disclosure. The ESD performances of the SCR structures implemented with the bipolar device 200 the bipolar device 222, and the bipolar device 242 are represented by a curve 302, a curve 304, and a curve 306, respectively.

It is clearly shown that the ESD performance represented by the curve 302 is much worse than the performances represented by the curves 304 and 306. With reference to both FIGS. 1C and 3, this is mainly caused by the existence of the buried layer 112 and the N+ collector/sinker 132 in the bipolar device 122, which can prevent the SCR structure from turning on, since the buried layer 112 is a high doping concentration layer while the N+ collector/sinker 132 is driven deep into the N-well 128, thereby providing little resistance. The ESD performances represented by the other two curves are similar and much better than the ESD performance represented by the curve 302. It is shown in the graph 300 that the holding voltage for all three implementations will increase until the current increases to a point where the SCR triggers. The SCR current trigger point in this example is approximately 50 mA. The curve 304 shows that the holding voltage for the SCR structure implemented with the bipolar device 222 will reach 30 Volts before the SCR current reaches 50 mA, while the curve 306 shows that the holding voltage for the SCR structure implemented with the bipolar device 242 reaches 21 Volts before the SCR current reaches 50 mA. Both curves 304 and 306 demonstrate a much better ESD performance than the curve 302.

Figure 4A:
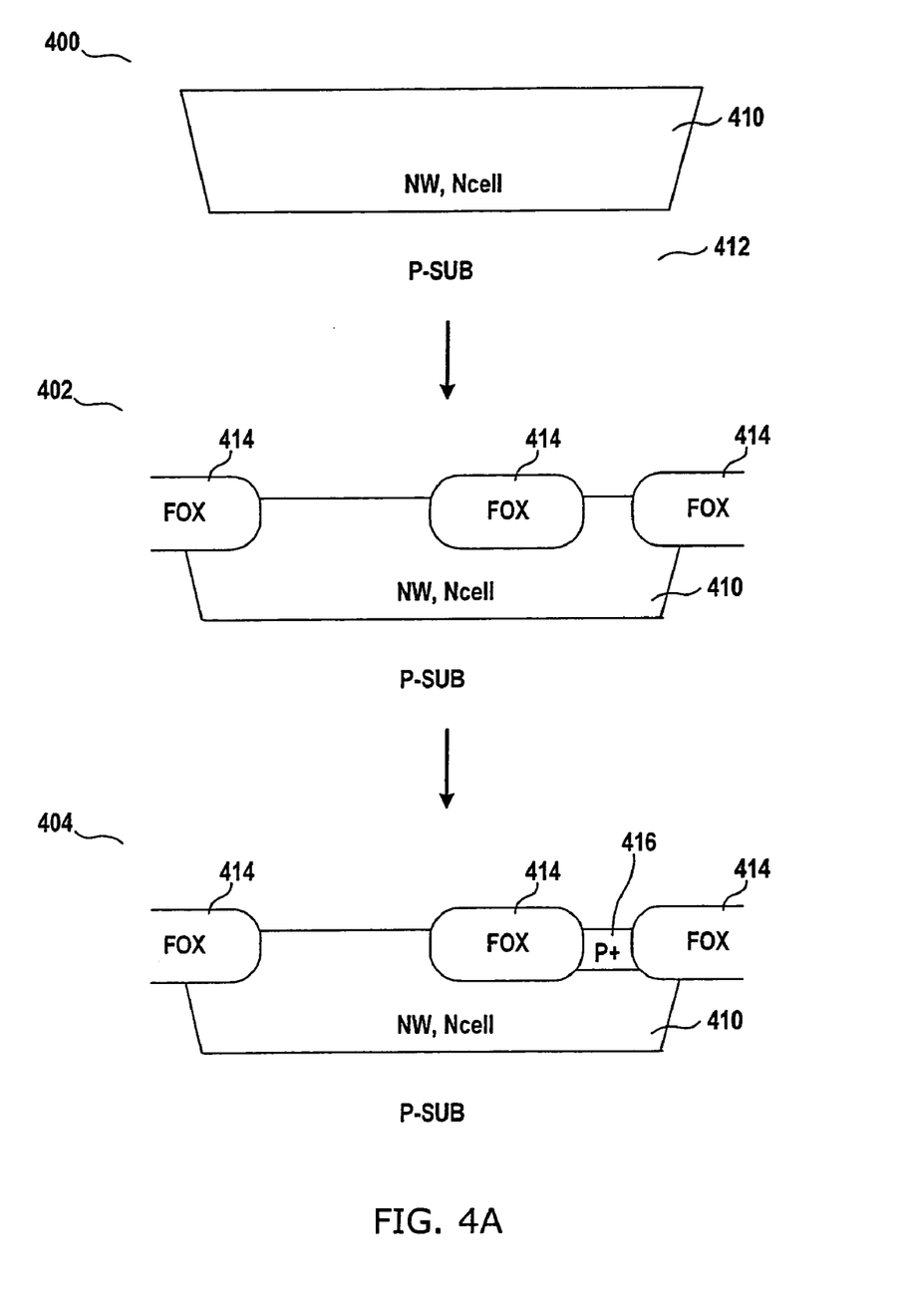
FIGS. 4A-4B present partial process flows for fabricating the bipolar device in accordance with the third embodiment of the present disclosure.
Figure 4B:
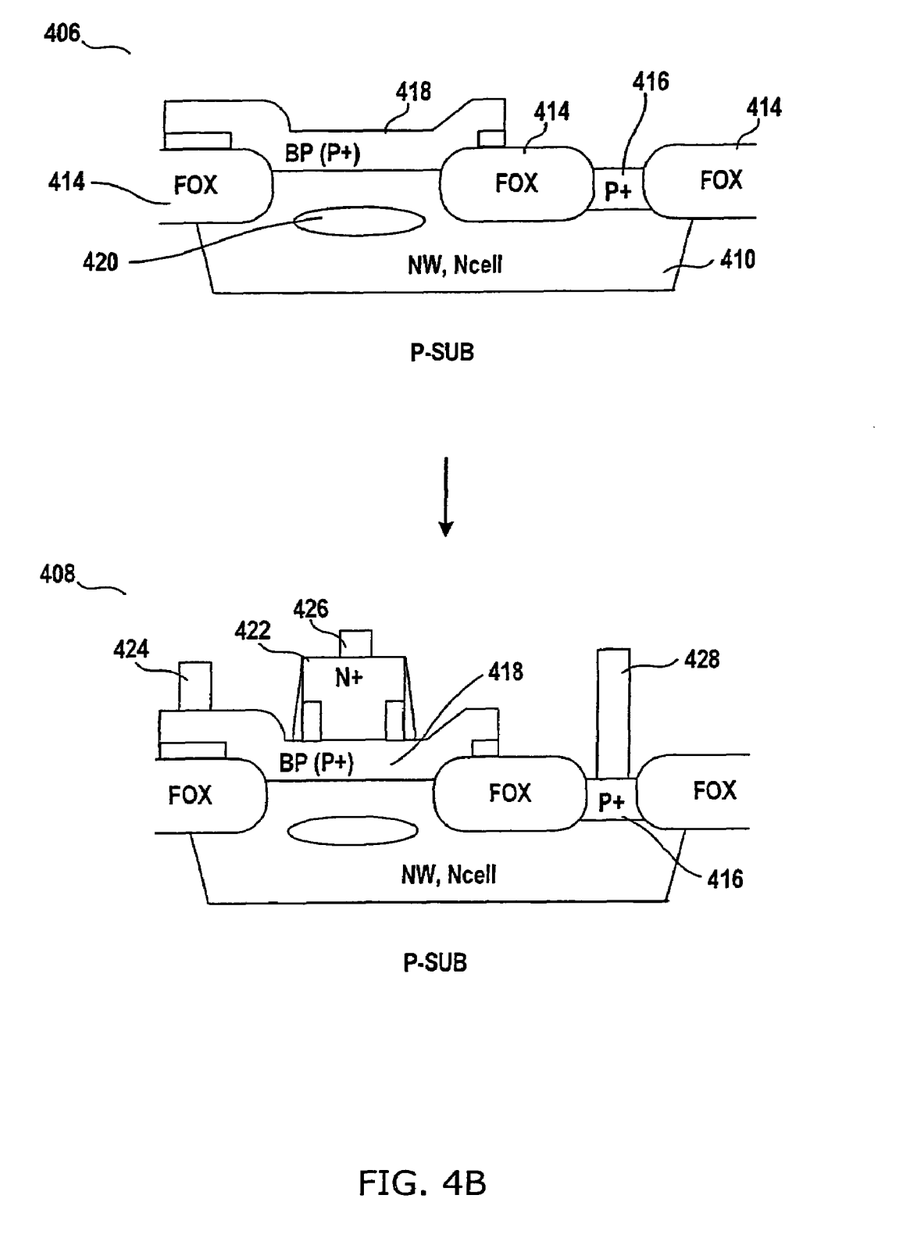

FIGS. 4A-4B present partial process flows for fabricating the bipolar device 242 in accordance with the third embodiment of the present disclosure. It is understood that the combination of the flow in FIG. 4A and the flow in FIG. 4B, with the latter immediately following the former, constitutes a complete process flow having incremental steps 400, 402, 404, 406, and 408, for fabricating the bipolar device 242.

In step 400, a N-well 410 is formed directly above a P-type substrate 412 without a buried layer in between. This allows the N-well 410 to provide a higher resistance, thereby allowing SCR to perform much better. With the N-well 410 formed, the wafer is then oxidized and coated with photoresist and patterned using the isolation mask to create field oxides 414 in step 402. There are isolation windows between the field oxides 414 to allow other insertions to be made into the N-well 410 in future processing steps.

In processing step 404, a thin, P+ material 416 is implanted into the N-well 410 between some field oxides 414 rather than a N+ collector/sinker to improve SCR performance by providing more resistance with the N-well 410. With the P+ material 416 driven into the N-well 410, a base mask is used to pattern a P+ base region 418 in step 406. The P+ base region 418 also covers some of the field oxides 414 to increase surface doping and thick field threshold. An optional local collector 420 can be implemented at the N-well 410, after the base region 418 is formed to reduce the resistance for improving the general performance of the bipolar device. In one embodiment of the disclosure, phosphorus is used for n type implant. However, it is understood that the implementation of the local collection has no effect on ESD performance.

Finally, in step 408, an N+ emitter 422 is diffused into the base region 418. When the N+ emitter 422 is formed, metal contacts 424, 426, and 428 are also implemented at the base 418, the emitter 422, and the collector 416 during to provide the necessary connections.

This disclosure provides systems and methods for implementing a new bipolar-based SCR for ESD protection. By removing the buried layer, and by replacing the deep collector/sinker with a smaller P+ junction, SCR and ESD performances may be improved dramatically.

The above illustration provides many different embodiments or embodiments for implementing different features of the disclosure. Specific embodiments of components and processes are described to help clarify the disclosure. These are, of course, merely embodiments and are not intended to limit the disclosure from that described in the claims.

Although the disclosure is illustrated and described herein as embodied in one or more specific examples, it is nevertheless not intended to be limited to the details shown, since various modifications and structural changes may be made therein without departing from the spirit of the disclosure and within the scope and range of equivalents of the claims. Accordingly, it is appropriate that the appended claims be construed broadly and in a manner consistent with the scope of the disclosure, as set forth in the following claims.

What is claimed is:

1. A bipolar-based silicon controlled rectifier (SCR) circuit for electrostatic discharge (ESD) protection, the circuit comprising:

an N-well formed on a semiconductor substrate;
a P+ collector region formed directly in contact with the N-well;
a base region formed on the N-well and separated from the collector; and
an emitter region formed over the base region,
wherein when an electrostatic discharge (ESD) event occurs, the N-well and the P+ collector region provides a high resistance path to turn on the SCR.

2. The circuit of claim 1 further comprising a first and a second dielectric areas formed on the N-well, wherein the base region is between the first and second dielectric areas and the collector region is separated from the base region by either the first or second dielectric area.

3. The circuit of claim 2 wherein the base region is formed on at least a portion of the two dielectric areas.

4. The circuit of claim 2 wherein the dielectric areas are field oxides.

5. The circuit of claim 2 further comprising a buried layer to be formed between the N-well and the semiconductor substrate.

6. The circuit of claim 5 wherein the buried layer is N-type and lightly-doped.

7. The circuit of claim 2 further comprising a local collector underneath the base region.

8. The circuit of claim 1 wherein the base region is made of P+ type material.

9. The circuit of claim 1 wherein the emitter region is made of N+ type material.

10. The circuit of claim 1 further comprising a Pmoat guard ring and an Nmoat guard ring.

11. The circuit of claim 1 wherein the P+ collector region is formed as first terminal of pnpn structure.

12. A bipolar-based silicon controlled rectifier (SCR) circuit for electrostatic discharge (ESD) protection, the circuit comprising:

an N-well formed on a semiconductor substrate;
a P+ collector region formed directly in contact with the N-well;
a P+ base region formed on the N-well and separated from the collector;
an N+ emitter region formed over the base region; and
a first and a second dielectric areas formed on the N-well,
wherein the base region is between the first and second dielectric areas and the collector region is separated from the base region by either the first or second dielectric area, and
wherein when an electrostatic discharge (ESD) event occurs, the N-well and the P+ collector region provides a high resistance path to turn on the SCR.

13. The circuit of claim 12 wherein the base region is formed on at least a portion of the two dielectric areas.

14. The circuit of claim 12 further comprising an N-type buried layer to be formed between the N-well and the semiconductor substrate.

15. The circuit of claim 12 further comprising a Pmoat guard ring and an Nmoat guard ring surrounding the SCR.

16. The circuit of claim 12 further comprising a local collector underneath the base region.

17. A method for forming a bipolar-based silicon controlled rectifier (SCR) circuit for electrostatic discharge protection, the method comprising:

forming an N-well on a semiconductor substrate;
forming a first and a second dielectric regions on the N-well;

forming a base region between the two dielectric regions;

forming a P+ collector region directly in contact with the N-well and separated from the base region by one of the dielectric region;

forming a N+ emitter on a portion of the base region; and forming a Pmoat guard ring and a Nmoat guard ring surrounding the SCR, wherein the base, emitter, and collector are three nodes of a bipolar device and when an electrostatic discharge (ESD) event occurs, the P+ collector and the N-well provide a high resistance path to turn on the bipolar device.

18. The method of claim 17 further comprising forming a buried layer between the N-well and the semiconductor substrate.

19. The method of claim 17 further comprising forming a local collector in the N-well underneath the base region for providing a low resistance to improve non-ESD performance thereof.

20. The method of claim 17 further comprising forming one or more metal contacts connecting to the base, emitter, and collector regions.

* * * * *